United States Patent
Yen et al.

(10) Patent No.: US 9,978,688 B2
(45) Date of Patent: May 22, 2018

(54) SEMICONDUCTOR PACKAGE HAVING A WAVEGUIDE ANTENNA AND MANUFACTURING METHOD THEREOF

(71) Applicant: Advanced Semiconductor Engineering, Inc., Kaohsiung (TW)

(72) Inventors: Han-Chee Yen, Taipei (TW); Shih-Yuan Chen, Taipei (TW); Chien-Pai Lai, Hualien (TW); Ming-Hsien Cheng, Taichung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days. days.

(21) Appl. No.: 13/781,606

(22) Filed: Feb. 28, 2013

(65) Prior Publication Data

US 2014/0239465 A1   Aug. 28, 2014

(51) Int. Cl.
 *H01L 23/552* (2006.01)
 *H01L 21/56* (2006.01)
 (Continued)

(52) U.S. Cl.
 CPC ...... *H01L 23/552* (2013.01); *H01L 23/3121* (2013.01); *H01L 23/66* (2013.01); *H01L 24/97* (2013.01); *H01L 24/73* (2013.01); *H01L 2223/6627* (2013.01); *H01L 2223/6677* (2013.01); *H01L 2224/16225* (2013.01); *H01L 2224/32225* (2013.01); *H01L 2224/48227* (2013.01); *H01L 2224/73265* (2013.01); *H01L 2224/81005* (2013.01); *H01L 2224/85005* (2013.01); *H01L 2224/97* (2013.01); *H01L 2924/12042* (2013.01);
 (Continued)

(58) Field of Classification Search
 None
 See application file for complete search history.

(56) References Cited

U.S. PATENT DOCUMENTS

| | | | |
|---|---|---|---|
| 3,761,782 | A | 9/1973 | Youmans |
| 4,394,712 | A | 7/1983 | Anthony |
| (Continued) | | | |

FOREIGN PATENT DOCUMENTS

| | | | |
|---|---|---|---|
| CN | 101026263 | A | 8/2007 |
| CN | 101924567 | A | 12/2010 |
| (Continued) | | | |

OTHER PUBLICATIONS

TIPO Office Action with translation of search report, dated Nov. 10, 2015, for Taiwan Patent Application No. 102142680.
(Continued)

*Primary Examiner* — Khaja Ahmad
(74) *Attorney, Agent, or Firm* — Morgan Law Offices, PLC

(57) ABSTRACT

A semiconductor package comprises a substrate, a grounding layer, a encapsulant, a shielding layer, and a conductive element. The substrate includes a chip. The encapsulant encapsulates the grounding layer and the chip, wherein the encapsulant has an upper surface. The shielding layer is formed on the upper surface of the encapsulant. The conductive element surrounds a waveguide cavity and extends to the grounding layer. The grounding layer, the shielding layer and the conductive element together form a waveguide antenna.

14 Claims, 20 Drawing Sheets

(51) Int. Cl.
 *H01L 23/00* (2006.01)
 *H01L 23/66* (2006.01)
 *H01L 23/31* (2006.01)

(52) U.S. Cl.
 CPC ........... H01L 2924/15787 (2013.01); H01L 2924/19105 (2013.01); H01L 2924/3025 (2013.01)

(56) References Cited

U.S. PATENT DOCUMENTS

| | | | |
|---|---|---|---|
| 4,499,655 A | 2/1985 | Anthony | |
| 4,569,786 A | 2/1986 | Deguchi | |
| 4,807,021 A | 2/1989 | Okumura | |
| 4,814,205 A | 3/1989 | Arcilesi et al. | |
| 4,842,699 A | 6/1989 | Hua et al. | |
| 4,897,708 A | 1/1990 | Clements | |
| 4,982,265 A | 1/1991 | Watanabe et al. | |
| 5,166,097 A | 11/1992 | Tanielian | |
| 5,166,772 A | 11/1992 | Soldner et al. | |
| 5,191,405 A | 3/1993 | Tomita et al. | |
| 5,229,647 A | 7/1993 | Gnadinger | |
| 5,239,448 A | 8/1993 | Perkins et al. | |
| 5,308,443 A | 5/1994 | Sugihara | |
| 5,353,498 A | 10/1994 | Fillion et al. | |
| 5,355,016 A | 10/1994 | Swirbel et al. | |
| 5,400,039 A * | 3/1995 | Araki | H01Q 1/32 343/700 MS |
| 5,404,044 A | 4/1995 | Booth et al. | |
| 5,557,142 A | 9/1996 | Gilmore et al. | |
| 5,615,477 A | 4/1997 | Sweitzer | |
| 5,639,989 A | 6/1997 | Higgins, III | |
| 5,643,831 A | 7/1997 | Ochiai et al. | |
| 5,677,511 A | 10/1997 | Taylor et al. | |
| 5,694,300 A | 12/1997 | Mattei et al. | |
| 5,776,798 A | 7/1998 | Quan et al. | |
| 5,886,876 A | 3/1999 | Yamaguchi | |
| 5,895,229 A | 4/1999 | Carney et al. | |
| 5,998,292 A | 12/1999 | Black et al. | |
| 5,998,867 A | 12/1999 | Jensen et al. | |
| 6,093,972 A | 7/2000 | Carney et al. | |
| 6,150,193 A | 11/2000 | Glenn | |
| 6,225,694 B1 | 5/2001 | Terui | |
| 6,276,599 B1 | 8/2001 | Ogawa | |
| 6,329,631 B1 | 12/2001 | Yueh | |
| 6,376,769 B1 | 4/2002 | Chung | |
| 6,406,934 B1 | 6/2002 | Glenn et al. | |
| 6,448,506 B1 | 9/2002 | Glenn et al. | |
| 6,457,633 B1 | 10/2002 | Takashima et al. | |
| 6,577,013 B1 | 6/2003 | Glenn et al. | |
| 6,586,822 B1 | 7/2003 | Vu et al. | |
| 6,614,102 B1 | 9/2003 | Hoffman et al. | |
| 6,670,269 B2 | 12/2003 | Mashino | |
| 6,686,649 B1 | 2/2004 | Mathews et al. | |
| 6,699,787 B2 | 3/2004 | Mashino | |
| 6,740,546 B2 | 5/2004 | Corisis et al. | |
| 6,740,950 B2 | 5/2004 | Paek | |
| 6,740,959 B2 | 5/2004 | Alcoe et al. | |
| 6,757,181 B1 | 6/2004 | Villanueva | |
| 6,770,955 B1 | 8/2004 | Coccioli et al. | |
| 6,781,231 B2 | 8/2004 | Minervini | |
| 6,812,549 B2 | 11/2004 | Umetsu et al. | |
| 6,815,348 B2 | 11/2004 | Mashino | |
| 6,838,776 B2 | 1/2005 | Leal et al. | |
| 6,865,084 B2 | 3/2005 | Lin et al. | |
| 6,881,896 B2 | 4/2005 | Ebihara | |
| 6,962,829 B2 | 11/2005 | Glenn et al. | |
| 6,962,869 B1 | 11/2005 | Bao et al. | |
| 6,998,532 B2 | 2/2006 | Kawamoto et al. | |
| 7,030,469 B2 | 4/2006 | Mahadevan et al. | |
| 7,042,398 B2 | 5/2006 | Tang et al. | |
| 7,045,385 B2 | 5/2006 | Kim et al. | |
| 7,049,682 B1 | 5/2006 | Mathews et al. | |
| 7,078,269 B2 | 7/2006 | Yamasaki et al. | |
| 7,081,661 B2 | 7/2006 | Takehara et al. | |
| 7,125,744 B2 | 10/2006 | Takehara et al. | |
| 7,134,198 B2 | 11/2006 | Nakatani | |
| 7,157,372 B1 | 1/2007 | Trezza | |
| 7,161,252 B2 | 1/2007 | Tsuneoka et al. | |
| 7,168,928 B1 | 3/2007 | Kikuchi et al. | |
| 7,187,060 B2 | 3/2007 | Usui | |
| 7,215,032 B2 | 5/2007 | Trezza | |
| 7,222,420 B2 | 5/2007 | Moriizumi | |
| 7,238,590 B2 | 7/2007 | Yang et al. | |
| 7,262,475 B2 | 8/2007 | Kwon et al. | |
| 7,276,787 B2 | 10/2007 | Edelstein et al. | |
| 7,285,434 B2 | 10/2007 | Yee et al. | |
| 7,298,030 B2 | 11/2007 | McWilliams et al. | |
| 7,327,015 B2 | 2/2008 | Yang et al. | |
| 7,334,326 B1 | 2/2008 | Huemoeller et al. | |
| 7,342,303 B1 | 3/2008 | Berry et al. | |
| 7,365,436 B2 | 4/2008 | Yamano | |
| 7,371,602 B2 | 5/2008 | Yee | |
| 7,388,293 B2 | 6/2008 | Fukase et al. | |
| 7,415,762 B2 | 8/2008 | Fukase et al. | |
| 7,451,539 B2 | 11/2008 | Morris et al. | |
| 7,478,474 B2 | 1/2009 | Koga | |
| 7,482,272 B2 | 1/2009 | Trezza | |
| 7,488,903 B2 | 2/2009 | Kawagishi et al. | |
| 7,504,721 B2 | 3/2009 | Chen et al. | |
| 7,508,057 B2 | 3/2009 | Shiraishi et al. | |
| 7,508,079 B2 | 3/2009 | Higashi | |
| 7,528,053 B2 | 5/2009 | Huang et al. | |
| 7,538,033 B2 | 5/2009 | Trezza | |
| 7,553,752 B2 | 6/2009 | Kuan et al. | |
| 7,560,744 B2 | 7/2009 | Hsiao et al. | |
| 7,576,415 B2 | 8/2009 | Cha et al. | |
| 7,598,163 B2 | 10/2009 | Callahan et al. | |
| 7,605,463 B2 | 10/2009 | Sunohara | |
| 7,625,818 B2 | 12/2009 | Wang | |
| 7,629,674 B1 | 12/2009 | Foster | |
| 7,633,170 B2 | 12/2009 | Yang et al. | |
| 7,633,765 B1 | 12/2009 | Scanlan et al. | |
| 7,642,132 B2 | 1/2010 | Huang et al. | |
| 7,656,023 B2 | 2/2010 | Sunohara et al. | |
| 7,656,047 B2 | 2/2010 | Yang et al. | |
| 7,659,202 B2 | 2/2010 | Trezza | |
| 7,666,711 B2 | 2/2010 | Pagaila et al. | |
| 7,678,685 B2 | 3/2010 | Sunohara et al. | |
| 7,681,779 B2 | 3/2010 | Yang | |
| 7,687,397 B2 | 3/2010 | Trezza | |
| 7,691,747 B2 | 4/2010 | Lin et al. | |
| 7,700,411 B2 | 4/2010 | Yang et al. | |
| 7,733,661 B2 | 6/2010 | Kossives et al. | |
| 7,741,148 B1 | 6/2010 | Marimuthu et al. | |
| 7,741,152 B2 | 6/2010 | Huang et al. | |
| 7,741,156 B2 | 6/2010 | Pagaila et al. | |
| 7,745,910 B1 | 6/2010 | Olson et al. | |
| 7,772,081 B2 | 8/2010 | Lin et al. | |
| 7,772,118 B2 | 8/2010 | Yamano | |
| 7,786,008 B2 | 8/2010 | Do et al. | |
| 7,786,592 B2 | 8/2010 | Trezza | |
| 7,795,140 B2 | 9/2010 | Taguchi et al. | |
| 7,808,060 B2 | 10/2010 | Hsiao | |
| 7,808,111 B2 | 10/2010 | Trezza | |
| 7,811,858 B2 | 10/2010 | Wang et al. | |
| 7,816,265 B2 | 10/2010 | Wang | |
| 7,829,981 B2 | 11/2010 | Hsu | |
| 7,842,597 B2 | 11/2010 | Tsai | |
| 7,868,462 B2 | 1/2011 | Choi et al. | |
| 7,944,038 B2 | 5/2011 | Chiu et al. | |
| 2002/0017855 A1 | 2/2002 | Cooper et al. | |
| 2002/0094605 A1 | 7/2002 | Pai et al. | |
| 2003/0122079 A1* | 7/2003 | Pobanz | H01L 27/14649 250/336.1 |
| 2004/0020673 A1 | 2/2004 | Mazurkiewicz | |
| 2004/0124518 A1 | 7/2004 | Karnezos | |
| 2004/0150097 A1 | 8/2004 | Gaynes et al. | |
| 2004/0178500 A1 | 9/2004 | Usui | |
| 2004/0231872 A1 | 12/2004 | Arnold et al. | |
| 2004/0252475 A1 | 12/2004 | Tsuneoka et al. | |
| 2004/0259292 A1 | 12/2004 | Beyne et al. | |
| 2005/0013082 A1 | 1/2005 | Kawamoto et al. | |
| 2005/0029673 A1 | 2/2005 | Naka et al. | |

(56) References Cited

U.S. PATENT DOCUMENTS

| | | |
|---|---|---|
| 2005/0039946 A1 | 2/2005 | Nakao |
| 2005/0045358 A1 | 3/2005 | Arnold |
| 2005/0104780 A1* | 5/2005 | Gottwald ............. H01Q 1/3241 343/700 MS |
| 2005/0189635 A1 | 9/2005 | Humpston et al. |
| 2005/0208702 A1 | 9/2005 | Kim |
| 2005/0258545 A1 | 11/2005 | Kwon |
| 2006/0027632 A1 | 2/2006 | Akram |
| 2006/0049995 A1* | 3/2006 | Imaoka .................... H01Q 1/22 343/702 |
| 2006/0145361 A1 | 7/2006 | Yang et al. |
| 2006/0197216 A1 | 9/2006 | Yee |
| 2006/0266547 A1 | 11/2006 | Koga |
| 2007/0048896 A1 | 3/2007 | Andry et al. |
| 2007/0138562 A1 | 6/2007 | Trezza |
| 2007/0187711 A1 | 8/2007 | Hsiao et al. |
| 2008/0061407 A1 | 3/2008 | Yang et al. |
| 2008/0174013 A1 | 7/2008 | Yang et al. |
| 2008/0042301 A1 | 8/2008 | Yang et al. |
| 2008/0272486 A1 | 11/2008 | Wang et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Leahy et al. |
| 2009/0002972 A1 | 1/2009 | Carey et al. |
| 2009/0025211 A1 | 1/2009 | Hiner et al. |
| 2009/0032928 A1 | 2/2009 | Chiang et al. |
| 2009/0035895 A1 | 2/2009 | Lee et al. |
| 2009/0039527 A1 | 2/2009 | Chan et al. |
| 2009/0102003 A1 | 4/2009 | Vogt et al. |
| 2009/0102033 A1 | 4/2009 | Raben |
| 2009/0140436 A1 | 6/2009 | Wang |
| 2009/0146297 A1 | 6/2009 | Badakere et al. |
| 2009/0166785 A1 | 7/2009 | Camacho et al. |
| 2009/0194851 A1 | 8/2009 | Chiu et al. |
| 2009/0194852 A1 | 8/2009 | Chiu et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0236700 A1 | 9/2009 | Moriya |
| 2009/0243045 A1 | 10/2009 | Pagaila et al. |
| 2009/0256244 A1 | 10/2009 | Liao et al. |
| 2009/0289343 A1 | 11/2009 | Chiu et al. |
| 2009/0294959 A1 | 12/2009 | Chiang et al. |
| 2009/0302435 A1 | 12/2009 | Pagaila et al. |
| 2009/0302437 A1 | 12/2009 | Kim et al. |
| 2009/0309235 A1 | 12/2009 | Suthiwongsunthorn et al. |
| 2009/0321916 A1 | 12/2009 | Wang et al. |
| 2010/0006330 A1 | 1/2010 | Fu et al. |
| 2010/0013064 A1 | 1/2010 | Hsu |
| 2010/0032815 A1 | 2/2010 | An et al. |
| 2010/0059855 A1 | 3/2010 | Lin et al. |
| 2010/0065948 A1 | 3/2010 | Bae et al. |
| 2010/0073255 A1 | 3/2010 | Noll |
| 2010/0109132 A1 | 5/2010 | Ko et al. |
| 2010/0110656 A1 | 5/2010 | Ko et al. |
| 2010/0133704 A1 | 6/2010 | Marimuthu et al. |
| 2010/0140737 A1 | 6/2010 | Lin et al. |
| 2010/0140751 A1 | 6/2010 | Tay et al. |
| 2010/0140752 A1 | 6/2010 | Marimuthu et al. |
| 2010/0140776 A1 | 6/2010 | Trezza |
| 2010/0148316 A1 | 6/2010 | Kim et al. |
| 2010/0187681 A1 | 7/2010 | Chen et al. |
| 2010/0197134 A1 | 8/2010 | Trezza |
| 2010/0199492 A1 | 8/2010 | Hiner et al. |
| 2010/0207257 A1 | 8/2010 | Lee |
| 2010/0207258 A1 | 8/2010 | Eun et al. |
| 2010/0207259 A1 | 8/2010 | Liao et al. |
| 2010/0230759 A1 | 9/2010 | Yang et al. |
| 2010/0230760 A1 | 9/2010 | Hung |
| 2010/0230788 A1 | 9/2010 | Peng |
| 2010/0244244 A1 | 9/2010 | Yang |
| 2010/0276690 A1 | 11/2010 | Chen |
| 2010/0327465 A1 | 12/2010 | Shen et al. |
| 2011/0048788 A1 | 3/2011 | Wang et al. |
| 2011/0068437 A1 | 3/2011 | Chiu et al. |
| 2011/0115056 A1 | 5/2011 | Chiu et al. |
| 2011/0115059 A1 | 5/2011 | Lee et al. |
| 2011/0115066 A1 | 5/2011 | Kim et al. |
| 2011/0127654 A1 | 6/2011 | Weng et al. |
| 2012/0206311 A1* | 8/2012 | Lee ........................ H01Q 13/06 343/785 |

FOREIGN PATENT DOCUMENTS

| | | |
|---|---|---|
| CN | 101026263 B | 6/2011 |
| CN | 102324416 A | 1/2012 |
| CN | 202275943 U | 6/2012 |
| JP | 08-288686 A | 1/1996 |
| JP | 2002246540 A | 8/2002 |
| JP | 2004228135 A | 8/2004 |
| TW | I242869 | 11/2005 |
| TW | 200612539 A | 4/2006 |
| WO | WO2004060034 A1 | 7/2004 |

OTHER PUBLICATIONS

H. Uchimura et al., "Development of the 'Laminated Waveguide'," Microwave Symposium Digest, vol. 3, pp. 1811-1814, Jun. 1998.

SIPO Office Action, dated Jun. 13, 2016, for Chinese Patent Application No. 201310645953.9.

SIPO Office Action, dated Mar. 6, 2017, for Chinese Patent Application No. 201310645953.9.

SIPO Office Action, dated Jul. 11, 2017, for Chinese Patent Application No. 201310645953.9.

* cited by examiner

SEMICONDUCTOR PACKAGE HAVING A WAVEGUIDE ANTENNA AND MANUFACTURING METHOD THEREOF

BACKGROUND OF THE INVENTION

Field of the Invention

The present invention relates in general to semiconductor packaging, and, more particularly, to a semiconductor package with a waveguide antenna and a manufacturing method thereof.

Description of the Related Art

Wireless communication devices, such as cell phones, require antennas for transmitting and receiving radio frequency (RF) signals. Conventionally, a wireless communication device includes therein an antenna and a communication module (e.g., a semiconductor device with RF communication capability), each disposed on different parts of a circuit board. Under the conventional approach, the antenna and the communication module are separately manufactured and electrically connected after being placed on the circuit board. Accordingly, higher manufacturing costs are incurred and a compact product design as well as reduced device size would be difficult to achieve.

Additionally, with the increasing usage of sensors, radar, high data rate links and focused power, applications at millimeter wave frequencies have become more critical. The advantages of working with short wavelengths include that physically the antenna structure can be small. However, circuitry can be very difficult to fabricate since interconnections can easily be an appreciable fraction of a wavelength.

SUMMARY OF THE INVENTION

One aspect of the disclosure relates to a semiconductor package. In one embodiment, the semiconductor package comprises a substrate including a chip; a grounding layer disposed on the substrate; an encapsulant covering the chip and the grounding layer; a conductive via extending from an upper surface of the encapsulant to the grounding layer; a shielding layer disposed on the encapsulant, the shielding layer electrically connected to the conductive via; and at least one signal emitting opening in the encapsulant exposing a cavity defining a waveguide. The grounding layer, the shielding layer and the conductive element together form an antenna. The conductive via is useable to transmit a radio frequency signal. In an embodiment, a plurality of conductive elements can be arranged along walls of the waveguide forming a funnel shape. In an embodiment, the waveguide can further include a conductive frame within the cavity extending from the conductive via outwardly to the signal emitting opening. In an embodiment, the at least one signal emitting opening includes an opening formed on a lateral surface of the encapsulant. In an embodiment, the at least one signal emitting opening includes a plurality of openings formed on an upper surface of the encapsulant. These openings can be substantially rectangular and arranged in a linear fashion or as a matrix.

Another aspect of the disclosure relates to a semiconductor package that comprises a substrate including a chip; a package body encapsulating the chip; a grounding layer disposed on an upper surface of the package body; an encapsulant covering the package body and the grounding layer; a conductive via extending from an upper surface of the encapsulant to the grounding layer; a shielding layer disposed on the encapsulant, the shielding layer electrically connected to the conductive via; and at least one signal emitting opening in the encapsulant exposing a cavity defining a waveguide. The grounding layer, the shielding layer and the conductive element together form an antenna. The conductive via is useable to transmit a radio frequency signal. In an embodiment, a plurality of conductive elements can be arranged along walls of the waveguide forming a funnel shape. In an embodiment, the waveguide is funnel-shaped and, from a vertical perspective, overlaps the chip.

Another aspect of the disclosure relates to manufacturing methods. In one embodiment, a manufacturing method comprises providing a substrate including a chip; forming a encapsulant encapsulating the substrate and the chip, wherein the encapsulant has an upper surface; forming a conductive element to define a waveguide cavity, wherein the conductive element is disposed on the grounding layer; and forming a shielding layer on the upper surface of the encapsulant, wherein the conductive element electrically connects the shielding layer, the shielding layer having an aperture corresponding to the waveguide cavity; wherein the grounding layer, and the grounding layer, the shielding layer and the conductive element form a waveguide antenna.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1A:
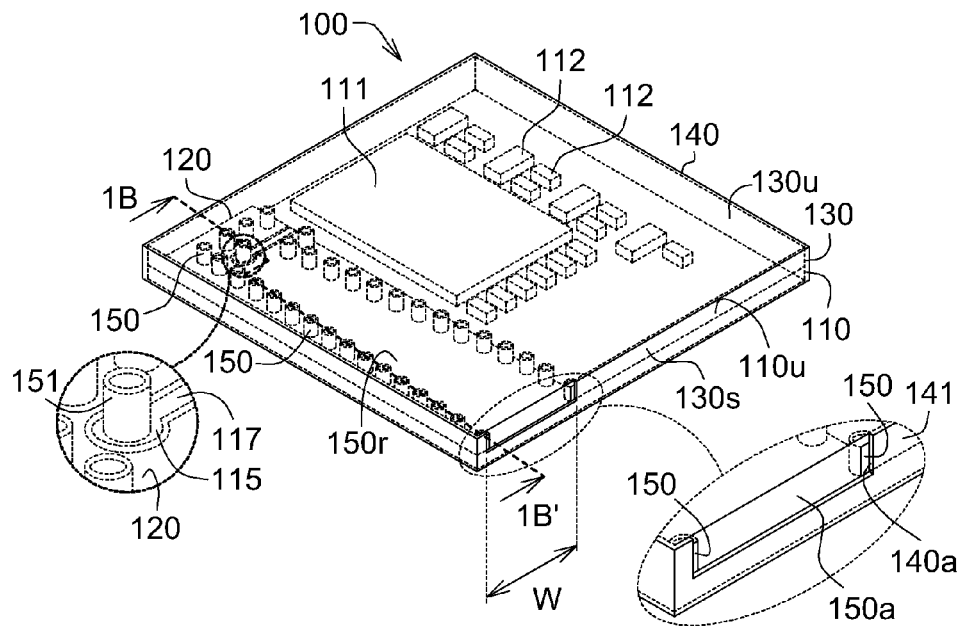
FIG. 1A illustrates a three-dimensional view of a semiconductor package according to one embodiment of the invention.

Referring to FIG. 1A, a three-dimensional view of a semiconductor package 100, according to one embodiment of the invention, is illustrated. The semiconductor package 100 includes a substrate 110, a feeding contact 115, a grounding layer 120, an encapsulant 130, a shielding layer 140 and a plurality of conductive elements 150.

The substrate 110 has mounted to it at least one chip or die 111, such as a RF chip, and at least one passive component 112. The chip 111 may be coupled to an upper surface 110u of the substrate 110 in a "face-down" orientation, i.e., an active surface of the chip 111 facing the substrate 110. The chip 111 is electrically connected to the substrate 110 via a plurality of solder balls. This configuration is sometimes referred to as flipchip. In another embodiment, the chip 111 may be coupled to the substrate 110 in a "face-up" orientation, i.e., the active surface of the chip 111 facing opposite the substrate 110. In this case, the chip 111 is electrically connected to the substrate 110 via a plurality of conductive wires. The passive component 112 may be a resistor, an inductor, a capacitor or other component not having active circuitry. In addition, the substrate 110 may be a multi-layered organic substrate or a ceramic substrate, for example. The feeding contact 115 is disposed on the substrate 110 and electrically connected to the chip 111.

The encapsulant 130 encapsulates the grounding layer 120 and the chip 111, wherein the encapsulant 130 has an upper surface 130u. The material of the encapsulant 130 may include novolac-based resin, epoxy-based resin, silicone-based resin or other suitable encapsulant. Preferably, the material is of low dissipation factor, wherein the loss tangent of the material is substantially less than about 0.01.

The shielding layer 140 is formed on the upper surface 130u of the encapsulant 130, a lateral surface 130s of the encapsulant 130 and a lateral surface 110s of the substrate 110. The shielding layer 140 has an aperture 140a formed on a lateral portion 141 of the shielding layer 140 to expose some conductive elements 150. The shielding layer 140 may include aluminum, copper, chromium, tin, gold, silver, nickel, stainless steel or any other suitable metal or alloy. In addition, the shielding layer 140 may be multi-layer structure or single-layer structure.

The conductive elements 150 encapsulated by the encapsulant 130 are disposed on the grounding layer 120 and electrically connected to the shielding layer 140. Accordingly, the conductive elements 150, the grounding layer 120 and the shielding layer 140 together form a waveguide antenna. The conductive elements 150 are capable of directing RF energy precisely to where it is needed and function as a high-pass filter. A waveguide cavity 150r is defined by the conductive elements 150 and a signal emitting opening 150a, which is formed on the lateral surface 130s of the encapsulant 130 and corresponding to the conductive elements 150. A radio frequency signal is guided within the waveguide cavity 150r and then emitted out of the semiconductor package 100 from a signal emitting opening 150a.

As illustrated in FIG. 1A, a width W of the signal emitting opening 150a determines a cutoff frequency $f_c$. The cutoff frequency is the frequency at which all lower frequencies are attenuated by the conductive elements 150, and all higher frequencies propagate within the conductive elements 150. The formula of the cutoff frequency is given by $$f_c = \frac{2}{2W} \quad (1)$$

In the above, c is the speed of light within the waveguide.

Figure 1B:
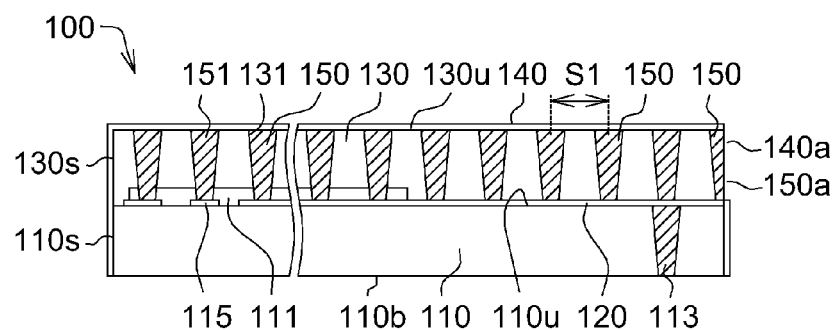
FIG. 1B illustrates a cross-sectional view along line 1B-1B' of the semiconductor package of FIG. 1A.

Referring to FIG. 1B, a cross-sectional view of FIG. 1A along line 1B-1B' is illustrated. The grounding layer 120 is formed on the upper surface 110u of the substrate 100 and electrically connected to a grounding element 113 formed within the substrate 110. The grounding element 113 is electrically connected to a grounding end (not illustrated) in a PCB or substrate, such that the grounding layer 120 is electrically connected the grounding end through the grounding element 113. In the present embodiment, the grounding element 113 is a conductive via which extends to a bottom surface 110b from the upper surface 110u. In another embodiment, the grounding element 113 is a patterned conductive layer.

As illustrated in FIG. 1B, the encapsulant 130 has several through holes or openings 131, such as a TMV (through mold via), extending from the upper surface 130u of the encapsulant 130 to the grounding layer 120. The conductive elements 150 are formed by filling the openings 131 of the encapsulant 130 with conductive material, such as Cu, Al, Sn, Ni, Au, or Ag. Accordingly, the conductive elements can electrically connect the shielding layer 140 and the grounding layer 120. The conductive elements 150 include a conductive element 151 that connects the feeding contact 115 and the shielding layer 140. The other conductive elements 150 are connected to the grounding layer 120. Since the conductive element 151 is used to transmit radio frequency signals, certain of the other conductive elements 150 can be disposed adjacent to the conductive element 151 to reduce electromagnetic interference (EMI).

Figure 1C:
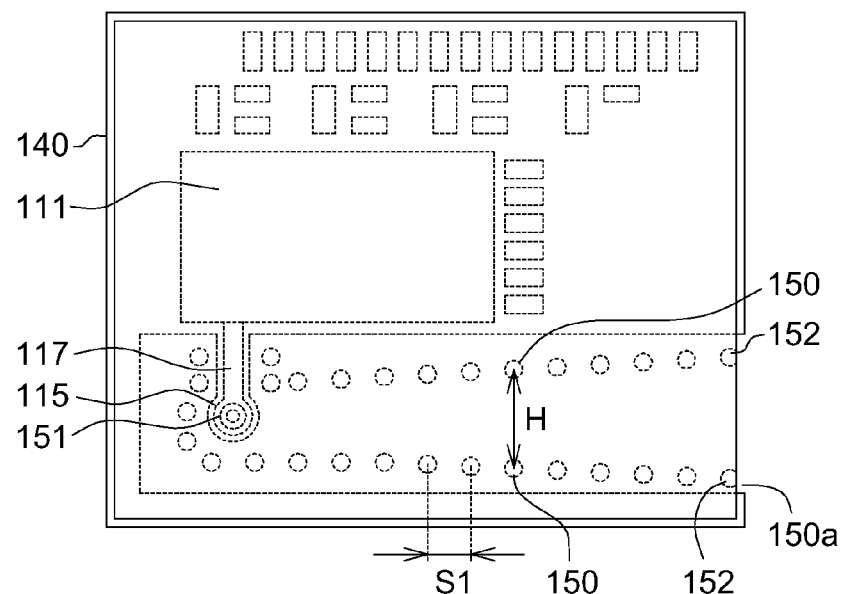
FIG. 1C illustrates a top view of the semiconductor package of FIG. 1A.

Referring to FIG. 1C, a top view of FIG. 1A is illustrated. The semiconductor package 100 further includes a conductive trace 117 connecting the chip 111 and the feeding contact 115. For example, the trace 117 is used to transmit radio frequency signal from the conductive element 151 to the chip 111, such as baseband chip. Accordingly, some of the conductive elements 150 are disposed adjacent to the chip 111 and the trace 117 to prevent the trace 117 from electromagnetic interference. In addition, the conductive elements 150 include two peripheral conductive elements 152 exposed from the encapsulant 130 and the signal emitting opening 150a. In another embodiment, all conductive elements 150 may be covered by the encapsulant 130.

As illustrated in FIG. 1C, a distance H between two opposite conductive elements 150 is gradually reduced from the signal emitting opening 150a to the feeding contact 115, such that the conductive elements 150 are arranged as a funnel-shape. The distance S1 between adjacent two conductive elements 150 and a distance H between the two opposite conductive elements 150 are determined by an equivalent wavelength $\lambda_{eff}$ of emitted wireless signal.

Figure 2:
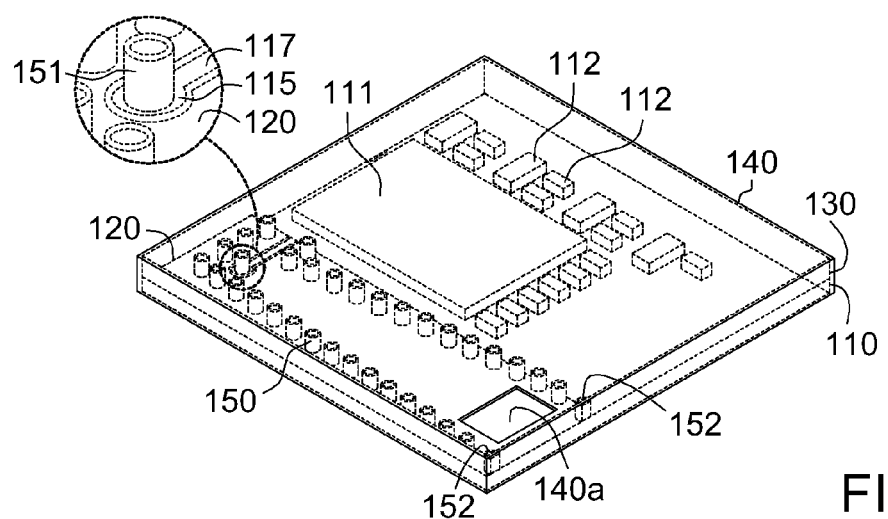
FIG. 2 illustrates a three-dimensional view of a semiconductor package according to another embodiment of the invention.

Referring to FIG. 2, a three-dimensional view of a semiconductor package 200, according to another embodiment of the invention, is illustrated. The semiconductor package 200 includes the substrate 110, the feeding contact 115, the grounding layer 120, the encapsulant 130, the shielding layer 140 and the conductive elements 150.

The shielding layer 140 has an aperture 140a overlapping a portion of the grounding layer 120, such that a radio frequency signal is emitted upward from the aperture 140a. The aperture 140a is disposed adjacent to the peripheral conductive elements 152. However, such orientation is not meant to be limiting. The shape of the aperture 140a is a rectangle. In another embodiment, the shape of the aperture 140a may be a circle, an ellipse or another type of polygon.

Figure 3:
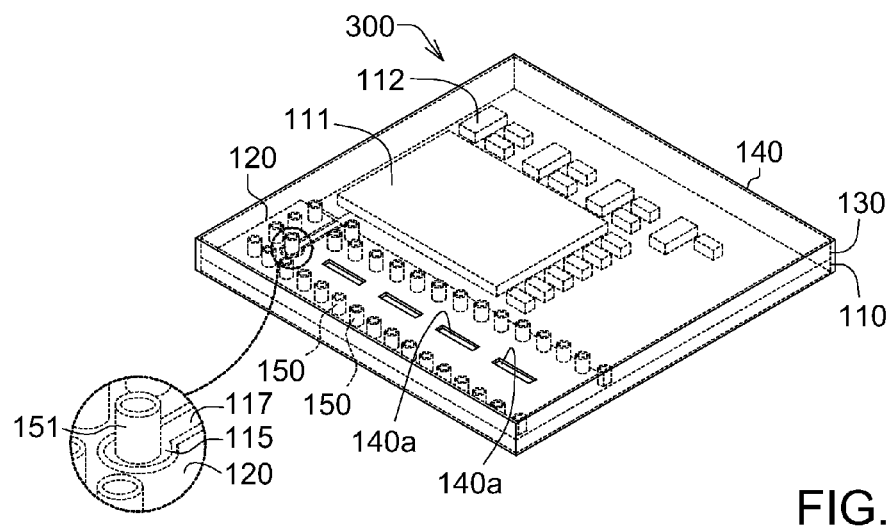
FIG. 3 illustrates a three-dimensional view of a semiconductor package according to another embodiment of the invention.

Referring to FIG. 3, a three-dimensional view of a semiconductor package 300, according to another embodiment of the invention, is illustrated. The semiconductor package 300 includes the substrate 110, the feeding contact 115, the grounding layer 120, the encapsulant 130, the shielding layer 140 and the conductive elements 150.

The shielding layer 140 has several apertures 140a overlapping a portion of the grounding layer 120, such that a radio frequency signal is emitted upward from the apertures 140a. At least one of the apertures 140a is a rectangular opening in the shielding layer 140. In another embodiment, at least one of the apertures 140a is an opening shaped as a circle, an ellipse or another type of polygon. In the present embodiment, the apertures 140a are arranged in line. In another embodiment, the apertures 140a may be arranged as a matrix.

Figure 4A:
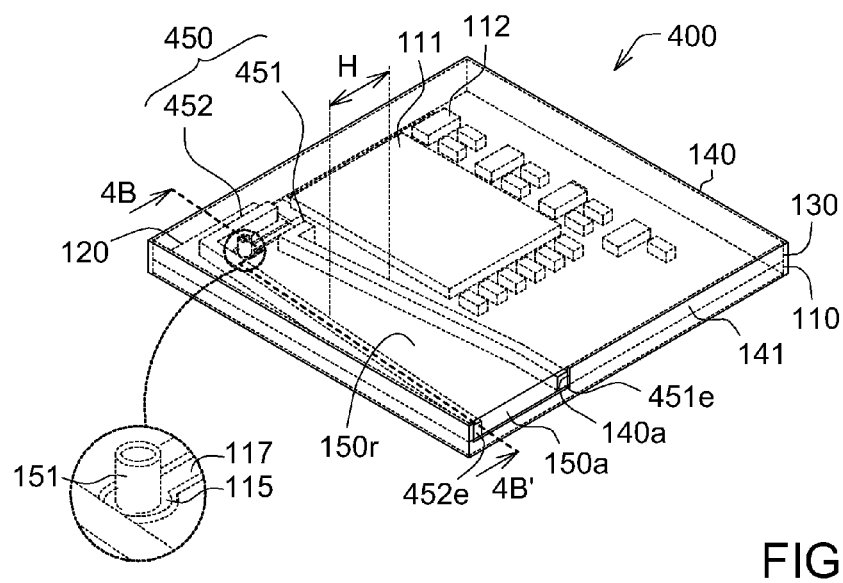
FIG. 4A illustrates a three-dimensional view of a semiconductor package according to another embodiment of the invention

Referring to FIG. 4A, a three-dimensional view of a semiconductor package 400, according to another embodiment of the invention, is illustrated. The semiconductor package 400 includes the substrate 110, the feeding contact 115, the grounding layer 120, the encapsulant 130, the shielding layer 140 and a conductive element 450.

The conductive element 450 is a conductive frame and forms a waveguide antenna together with the grounding layer 120 as well as the shielding layer 140. A waveguide cavity 150r and a signal emitting opening 150a are defined by the conductive element 450. In this way, a radio frequency signal is guided within the waveguide cavity 150r and then emitted out of the semiconductor package 400 from the signal emitting opening 150a.

As illustrated in FIG. 4A, the conductive element 450 includes a first brace 451 and a second brace 452. The first brace 451 and the second brace 452 are separated from each other, and a waveguide cavity 150r is defined between the first brace 451 and the second brace 452. The first brace 451 has a first end 451e, and the second brace 452 has a second end 452e. The shielding layer 140 has an aperture 140a formed on a lateral portion 141 of the shielding layer 140. The first end 451e and the second end 452e are exposed from the encapsulant 130 and the aperture 140a. A distance H between the first brace 451 and the second brace 452 is gradually reduced from two opposite first end 451e and second end 452e to the feeding contact 115, such that the conductive element 450 are arranged in the shape of a funnel. A wireless signal is guided within the waveguide cavity 150r and then emitted out of the semiconductor package 400 from the signal emitting opening 150a exposed from the aperture 140a.

Figure 4B:
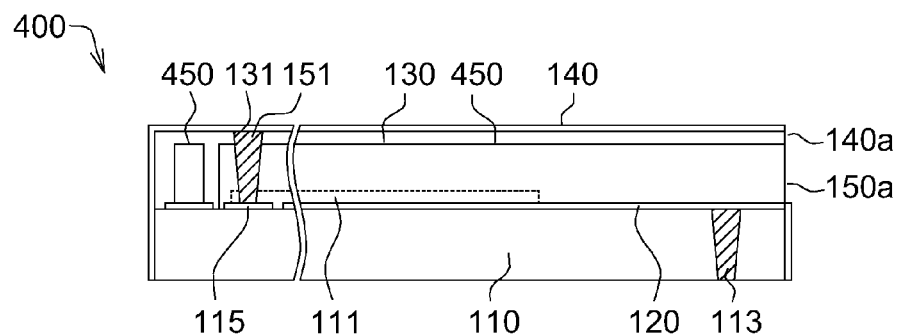
FIG. 4B illustrates a cross-sectional view along line 4B-4B' of the semiconductor package of FIG. 4A.

Referring to FIG. 4B, a cross-sectional view of FIG. 4A along line 4B-4B' is illustrated. The conductive element 450 is disposed on the grounding layer 120 and electrically connected to the grounding element 113 through the grounding layer 120. Accordingly, the conductive element 450 surrounding the feeding contact 115 and trace 117 can prevent the feeding contact 115 and trace 117 from electromagnetic interference (EMI).

Figure 5A:
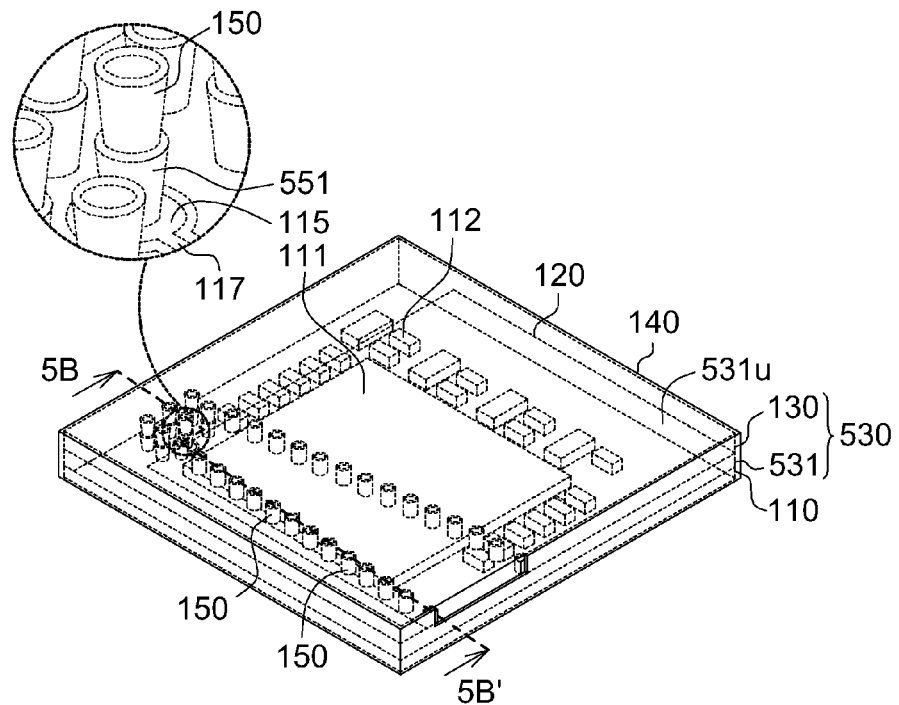
FIG. 5A illustrates a three-dimensional view of a semiconductor package according to another embodiment of the invention.

Referring to FIG. 5A, a three-dimensional view of a semiconductor package 500, according to another embodiment of the invention, is illustrated. The semiconductor package 500 includes the substrate 110, the feeding contact 115, the grounding layer 120, a covering 530, the shielding layer 140 and the conductive elements 150.

Referring to FIG. 5A, a chip 111, such as baseband chip and RF chip, and at least one passive component 112 are disposed on the substrate 110. The covering 530 includes a package body 531 and an encapsulant 130. The package body 531 covers the chip 111, the feeding contact 115 and the trace 117, and has an upper surface 531u. The grounding layer 120 is formed on the upper surface 531u of the package body 531, and the encapsulant 130 overlies the grounding layer 120. The conductive elements 150 are formed in the encapsulant 130. Accordingly, the chip 111 and the conductive elements 150 overlap when viewed in a vertical direction. In addition, at least one portion of the grounding layer 120 overlaps the chip 111 to prevent the chip 111 from EMI.

Figure 5B:
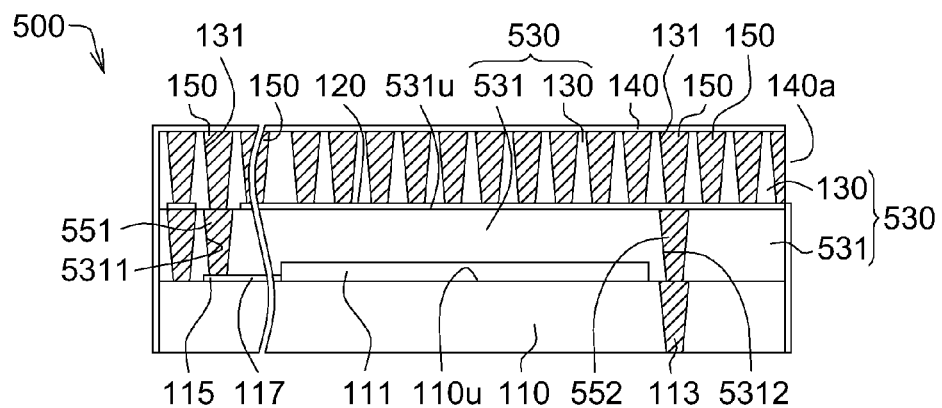
FIG. 5B illustrates a cross-sectional view along line 5B-5B' of the semiconductor package of FIG. 5A.

Referring to FIG. 5B, a cross-sectional view of FIG. 5A along line 5B-5B' is illustrated. The package body 531 has a feeding through hole 5311 exposing the feeding contact 115, and a feeding element 551 is formed by filling the feeding through hole 5311 with conductive material. The feeding element 551 is encapsulated by the package body 531 and electrically connected to the feeding contact 115. The encapsulant 130 has an through hole 131 exposing the feeding element 551, and the conductive element 150 is formed by filling the through hole 131 with conductive material and electrically connected to the feeding element 551.

As illustrated in FIG. 5B, the package body 531 has a ground through hole 5312 exposing the grounding element 113, and a grounding element 552 is formed by filling the ground through hole 5312 with conductive material and electrically connected to the grounding element 113. The encapsulant 130 has a through hole 131 exposing the grounding element 552, and the conductive element 150 is formed by filling the through hole 131 and electrically connected to the grounding element 552.

As illustrated in FIG. 5B, the encapsulant 130 has several through holes 131 exposing the grounding layer 120, and other conductive elements 150 are formed by filling up the through holes 131 with conductive material and electrically connected the grounding layer 120 and shielding layer 140.

Figure 6:
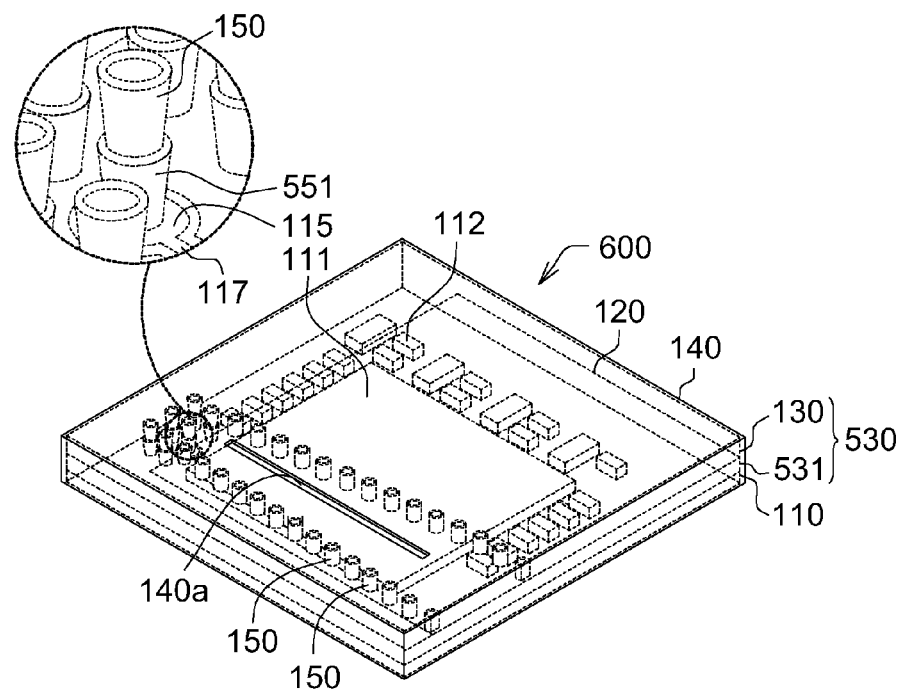
FIG. 6 illustrates a three-dimensional view of a semiconductor package according to another embodiment of the invention.

Referring to FIG. 6, a three-dimensional view of a semiconductor package 600, according to another embodiment of the invention, is illustrated. The semiconductor package 600 includes the substrate 110, the feeding contact 115, the grounding layer 120, the covering 530, the shielding layer 140 and the conductive elements 150.

The shielding layer 140 has the aperture 140a overlapping to a region of the grounding layer 120, such that the radio frequency signal is emitted upward from the aperture 140a. In the present embodiment, the aperture 140a is a rectangular opening in the shielding layer 140. In another embodiment, the aperture 140a may be shaped as a circle, an ellipse or a different polygon; however, such exemplification is not meant to be limiting.

Figure 7:
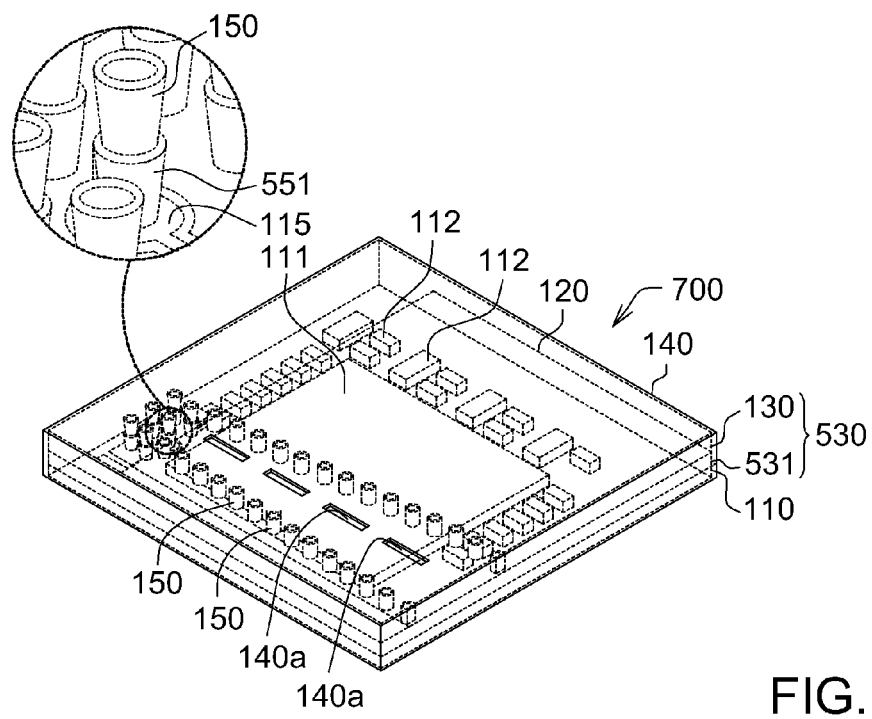
FIG. 7 illustrates a three-dimensional view of a semiconductor package according to another embodiment of the invention.

Referring to FIG. 7, a three-dimensional view of a semiconductor package 700, according to another embodiment of the invention, is illustrated. The semiconductor package 700 includes the substrate 110, the feeding contact 115, the grounding layer 120, the covering 530, the shielding layer 140 and the conductive elements 150.

The shielding layer 140 has several apertures 140a overlapping a portion of the grounding layer 120, such that radio frequency signals are emitted upward from the aperture 140a. At least one of the apertures 140a is a rectangular opening formed in the shielding layer 140. In other embodiments, at least one of the apertures 140a is shaped a circle, an ellipse or a different polygon. In the present embodiment, the apertures 140a are arranged in line. In another embodiment, the apertures 140a are arranged as a matrix.

Figure 8A:
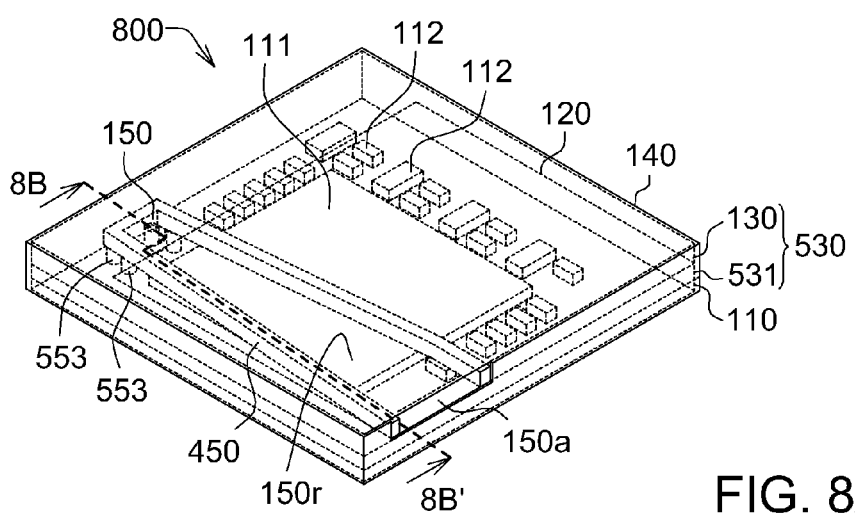
FIG. 8A illustrates a three-dimensional view of a semiconductor package according to another embodiment of the invention.

Referring to FIG. 8A, a three-dimensional view of a semiconductor package 800, according to another embodiment of the invention, is illustrated. The semiconductor package 800 includes the substrate 110, the feeding contact 115 (FIG. 8B), the grounding layer 120, the covering 530, the shielding layer 140 and the conductive element 450.

The conductive element 450 is a conductive frame and forms a waveguide antenna together with the conductive elements 450 and the grounding layer 120. Waveguide cavity 150r and the signal emitting opening 150a are defined by the conductive element 450. A radio frequency signal is guided within the waveguide cavity 150r and then emitted from the semiconductor package 800 by the signal emitting opening 150a.

Figure 8B:
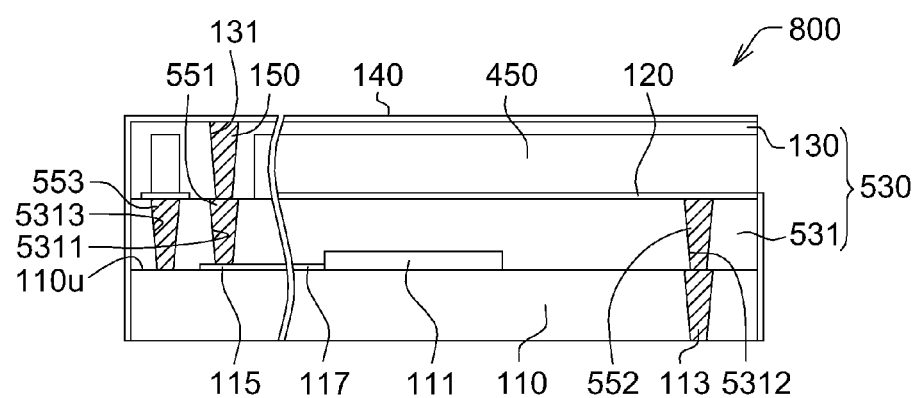
FIG. 8B illustrates a cross-sectional view along line 8B-8B' of the semiconductor package of FIG. 8A.

Referring to FIG. 8B, a cross-sectional view of FIG. 8A along line 8B-8B' is illustrated. The covering 530 includes package body 531 and encapsulant 130. The conductive element 450 is disposed over package body 531 encapsulating the chip 111, the feeding contact 115 and a trace 117. The grounding layer 120 is formed on the upper surface 531u of the package body 531, and the encapsulant 130 is formed on the grounding layer 120.

As illustrated in FIG. 8B, the package body 531 has feeding through hole 5311 exposing the feeding contact 115, and feeding element 551 is formed by filling the feeding through hole 5311 with conductive material and electrically connected to the feeding contact 115. The encapsulant 130 has through hole 131 exposing the feeding element 551, and the conductive element 150 is formed by filling the through 131 with conductive material and electrically connected to the feeding contact 115 through the feeding element 551.

The package body 531 has a ground through hole 5312 exposing the grounding element 113, and a grounding element 552 is formed by filling the ground through hole 5312 and electrically connected to the grounding layer 120. In this way, the grounding layer 120 is electrically connected to the grounding element 113 through the grounding element 552 encapsulated by the package body 531.

The package body 531 has a through hole 5313 exposing the upper surface 110u of the substrate 110, and a conductive element 553 is formed by filling the through hole 5313 with conductive material by plating or applying solder paste or another type of conductive material. In addition, several conductive elements 553 may be disposed adjacent the feeding element 551 and the feeding contact 115 to prevent the feeding element 551 and the feeding contact 115 from electromagnetic interference.

Figure 9A:
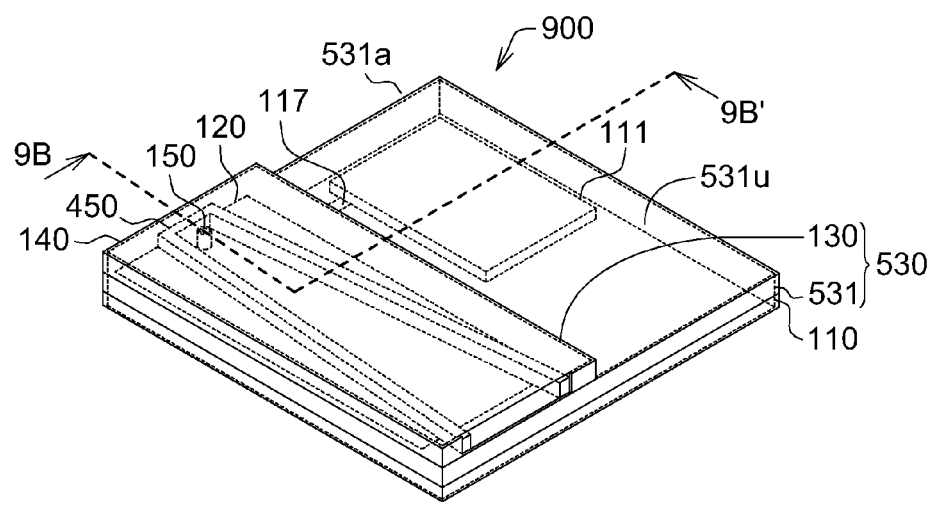
FIG. 9A illustrates a three-dimensional view of a semiconductor package according to another embodiment of the invention.

Referring to FIG. 9A, a three-dimensional view of a semiconductor package 900, according to another embodiment of the invention, is illustrated. The semiconductor package 900 includes the substrate 110, the feeding contact 115 (illustrated in FIG. 9B), the grounding layer 120, the covering 530, the shielding layer 140 and the conductive element 450.

The covering 530 includes the package body 531 and the encapsulant 130. The package body 531 has an upper surface 531u on which the grounding layer 120 is disposed, and the encapsulant 130 is formed on the grounding layer 120. The conductive element 450 is disposed on the grounding layer 120, and the encapsulant 130 encapsulates the conductive element 450. In order to make efficient use of the encapsulant 130, a portion of the upper surface 531u is not covered by the encapsulant 130 and accordingly a recess 531a is formed.

Figure 9B:
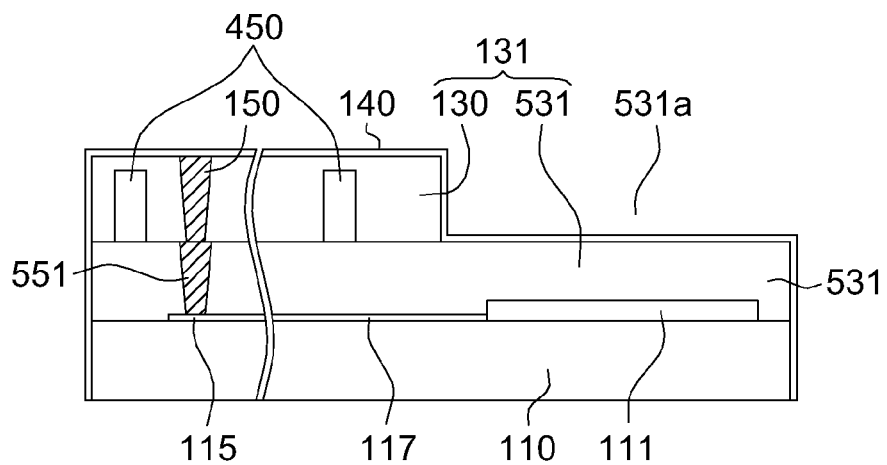
FIG. 9B illustrates a cross-sectional view along line 9B-9B' of the semiconductor package of FIG. 9A.

Referring to FIG. 9B, a cross-sectional view of FIG. 9A along line 9B-9B' is illustrated. The package body 531 encapsulates the chip 111, the feeding contact 115 and a trace 117. The recess 531a makes the consumption of the encapsulant 130 less, such that cost for the encapsulant 130 is reduced. In addition, the recess 531a can provide a space to accommodate an element which otherwise would interfere with other elements of the semiconductor package 900. Additionally, the recess 531a can provide a space to accommodate an element, such as a connector, a passive device and an active component, to make the system design more flexible.

Referring to FIGS. 10A-10G, manufacturing processes according to the semiconductor package of FIG. 1A are illustrated.

Figure 10A:
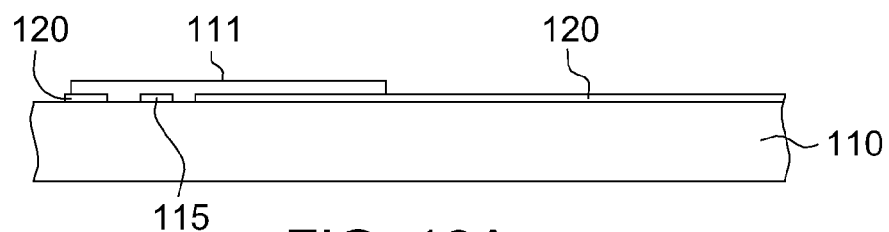
FIGS. 10A-10G illustrate manufacturing processes according to the semiconductor package of FIG. 1A.

Referring to FIG. 10A, the substrate 110 having the feeding contact 115, trace 117 (FIG. 1C) and the grounding layer 120 is provided, and the chip 111 is disposed on the substrate 110. Trace 117 connects the feeding contact 115 and the chip 111, and the grounding layer 120 is physically separated and electrically isolated from the feeding contact 115.

Figure 10B:
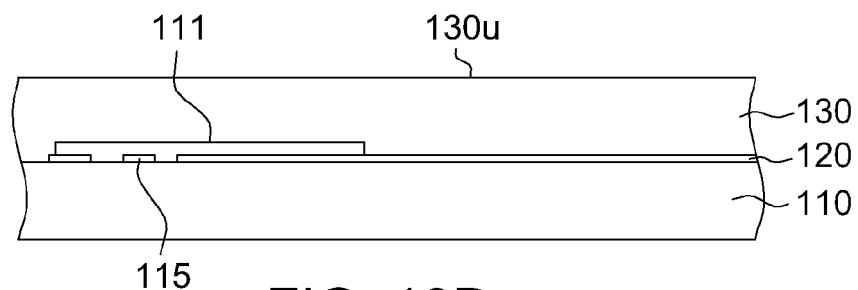

Referring to FIG. 10B, the encapsulant 130 encapsulating at least a portion of the substrate 110 and the chip 111 is formed, wherein the encapsulant 130 has an upper surface 130u.

Figure 10C:
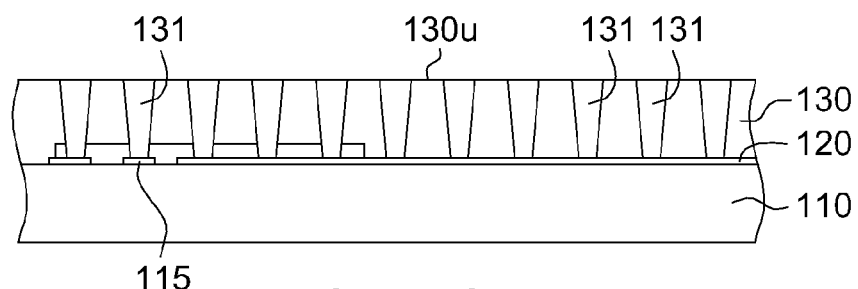

Referring to FIG. 10C, several through holes 131 exposing the grounding layer 120 and the feeding contact 115 are formed in the encapsulant 130 by using an appropriate laser or cutting tool.

Figure 10D:
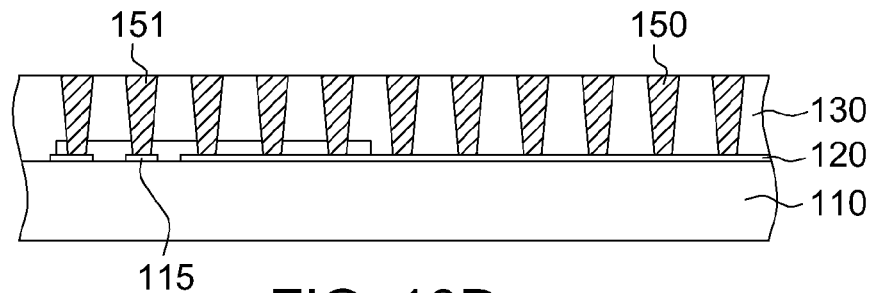

Referring to FIG. 10D, several conductive elements 150 defining a waveguide cavity 150r (illustrated in FIG. 1A) are formed by filling the through holes 131 with conductive material by sputtering, plating, printing, wire-bonding technology, surface-mount technology (SMT), solder paste or other techniques for applying conductive material. The conductive elements 150 contacts a grounding layer 120, and a conductive element 151 of the conductive elements 150 is connected to the feeding contact 115. In another embodiment, the conductive elements 150 may be wire and formed by using wire bonding technology before the encapsulant 130 is formed.

Figure 10E:
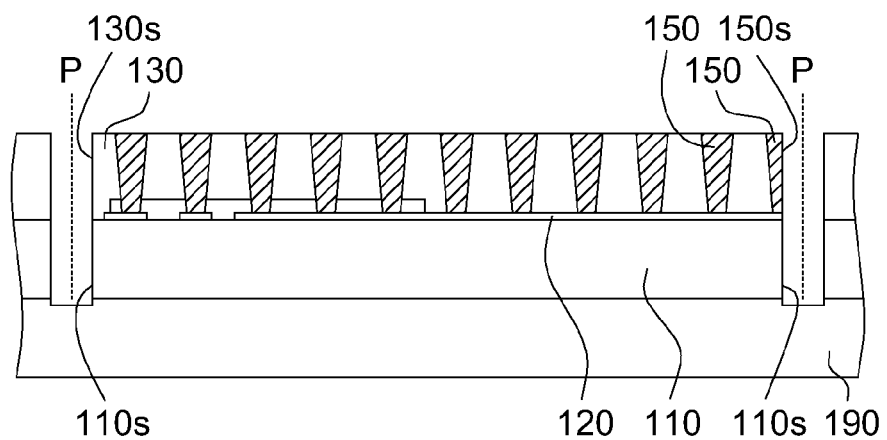

Referring to FIG. 10E, several singulation paths P passing through the encapsulant 130, the conductive elements 150 and the substrate 110 are formed by a laser or cutting tool. After the singulation paths P are formed, a lateral surface 150s of the conductive elements 150, a lateral surface 130s of the encapsulant 130 and a lateral surface 110s of the substrate 110 are exposed from the singulation paths P. In addition, the substrate 110 can be adhered onto a carrier 190 before the singulation paths P are formed. Singulation paths P may pass through a part of the carrier 190 to completely cut off the substrate 110 and the encapsulant 130.

Figure 10F:
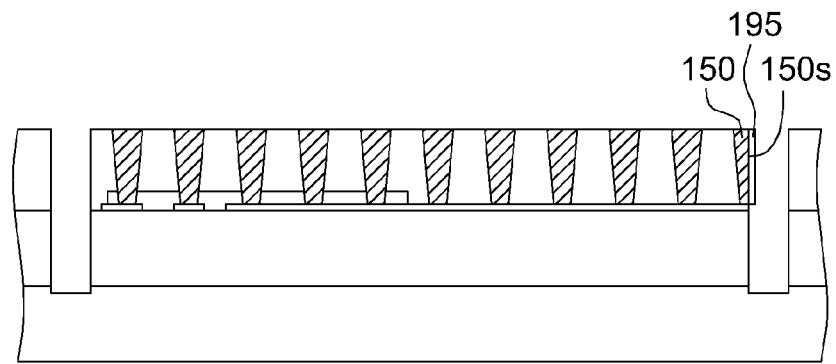

Referring to FIG. 10F, a tape 195 is pasted on the exposed lateral surface 150s of the conductive elements 150 to define the aperture 140a (illustrated in FIGS. 1A and 1B) of the shielding layer 140.

Figure 10G:
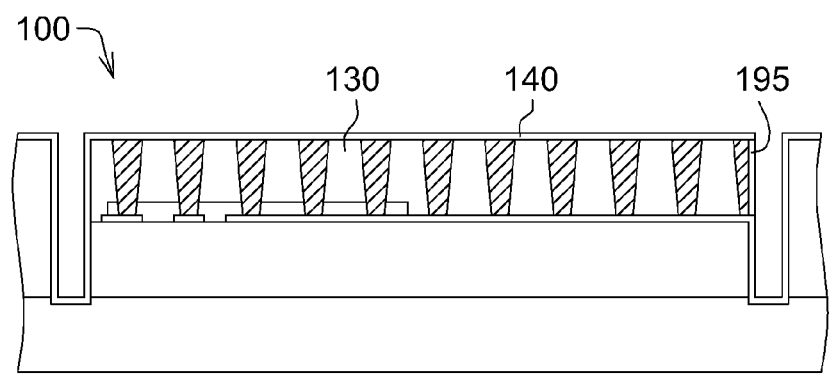

Referring to FIG. 10G, the shielding layer 140 is formed to cover the upper surface 130u and a portion of the lateral surface 130s of the encapsulant 130, which is not covered by the tape 195. After the tape 195 is removed, the semiconductor package 100, as illustrated in FIG. 1A, is formed. The shielding layer 140 can be formed using plating/etching photolithographic processes.

Figure 11:
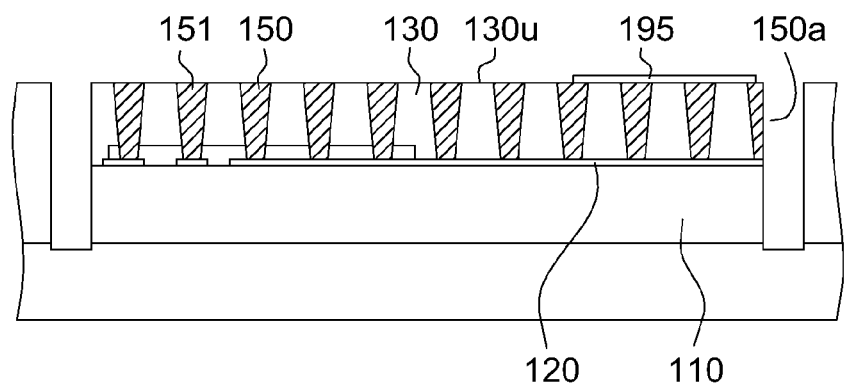
FIG. 11 illustrates a manufacturing process according to the semiconductor package of FIG. 2.

Referring to FIG. 11, a manufacturing process according to the semiconductor package of FIG. 2 is illustrated. The tape 195 in shape of, for example, a rectangle, a circle, an ellipse or other applicable-shape, is pasted on the upper surface 130u of the encapsulant 130 overlapping to the grounding layer 120 to define the aperture 140a of the shielding layer 140 as illustrated in FIG. 2. The tape 195 is disposed adjacent to the signal emitting opening 150a. The manufacturing processes are similar to those discussed for the semiconductor 100, and the similarities are not repeated here.

Figure 12:
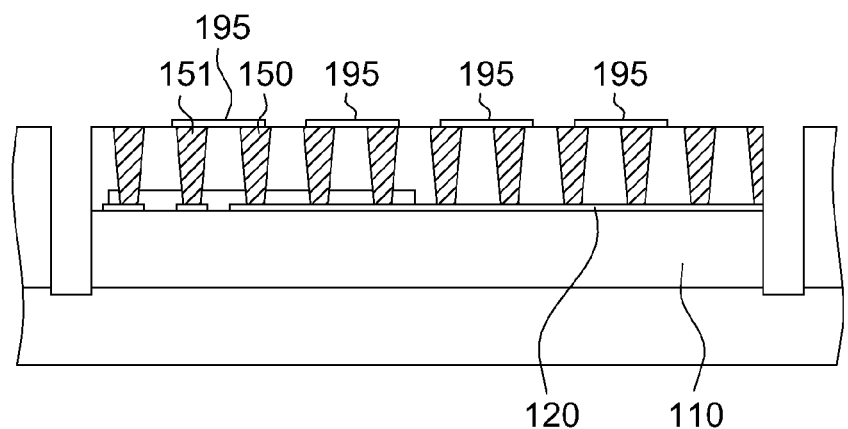
FIG. 12 illustrates a manufacturing process according to the semiconductor package of FIG. 3.

Referring to FIG. 12, a manufacturing process according to the semiconductor package of FIG. 3 is illustrated. Tapes 195 in the shape of a rectangle, a circle, an ellipse or other applicable-shape, are attached on the upper surface 130u of the encapsulant 130 overlapping to the grounding layer 120 to define several apertures 140a of the shielding layer 140 as illustrated in FIG. 3. The processes are similar to those for the semiconductor 100, and the similarities are not repeated here.

Figure 13A:
FIGS. 13A-13C illustrate manufacturing processes according to the semiconductor package of FIG. 4B.
Figure 13B:
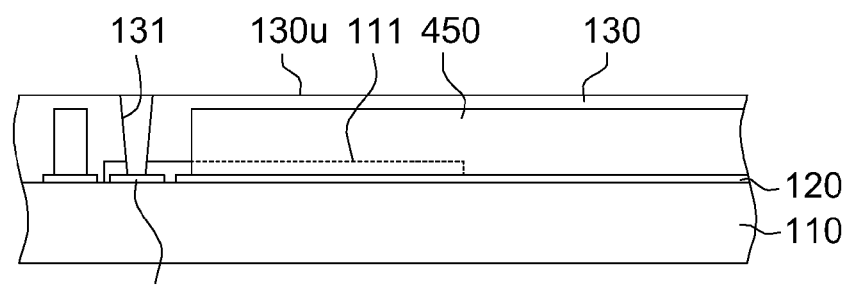
Figure 13C:
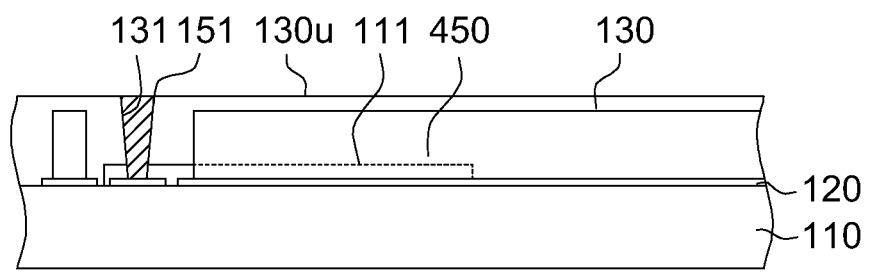

Referring to FIG. 13A-13C, manufacturing processes according to the semiconductor package of FIG. 4B are illustrated.

Referring to FIG. 13A, the conductive element 450 (of FIG. 4A) is disposed on the grounding layer 120 by using, for example, surface mount technology (SMT).

Referring to FIG. 13B, the encapsulant 130 encapsulating the conductive element 450, the substrate 110 and the chip 111 is formed, wherein the encapsulant 130 has an upper surface 130u.

Referring to FIG. 13B, the through holes 131 extending to the feeding contact 115 from the upper surface 130u of the encapsulant 130 are formed using an appropriate laser or cutting tool.

Referring to FIG. 13C, the conductive elements 151 are formed by filling the through holes 131 with conductive material by plating or applying solder paste or another type of conductive material. The conductive element 151 is extended to and electrically connected to the feeding contact 115. The processes are similar to those for the semiconductor 100, and the similarities are not repeated here.

Referring to FIG. 14A-14G, manufacturing processes according to the semiconductor package of FIG. 5B are illustrated.

Figure 14A:
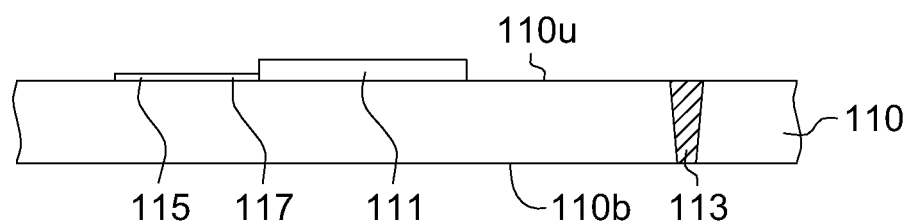
FIGS. 14A-14G illustrate manufacturing processes according to the semiconductor package of FIG. 5B.

Referring to FIG. 14A, the substrate 110 having a feeding contact 115, trace 117, the grounding element 113 and an upper surface 110u is provided, wherein the grounding element 113 is disposed within the substrate 110 and extended to lower surface 110b form the upper surface 110u of the substrate 110. The chip 111 is disposed on the upper surface 110u of the substrate, and the trace 117 connects the chip 111 and the feeding contact 115.

Figure 14B:
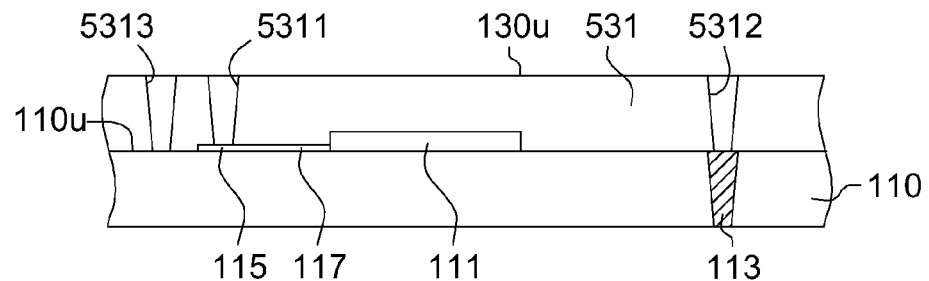

Referring to FIG. 14B, the package body 531 encapsulating at least a portion of the substrate 110, the chip 111, the feeding contact 115 and the trace 117 is formed, wherein the encapsulant 130 has an upper surface 130u. The material of the package body 531 may include novolac-based resin, epoxy-based resin, silicone-based resin or other suitable encapsulant. The package body 531 may also include suitable fillers such as powdered silicon dioxide. The package body 531 can be formed by various packaging technologies, such as, for example, compression molding, injection molding or transfer molding.

Referring to FIG. 14B, the feeding through holes 5311 exposing the feeding contact 115 are formed in the encapsulant 130 by using an appropriate laser or cutting tool. In addition, the grounding through hole 5312 exposing the grounding element 113 of the substrate 110 and through holes 5313 exposing the upper surface 110u of the substrate 110 are formed by using an appropriate laser or cutting tool.

Figure 14C:
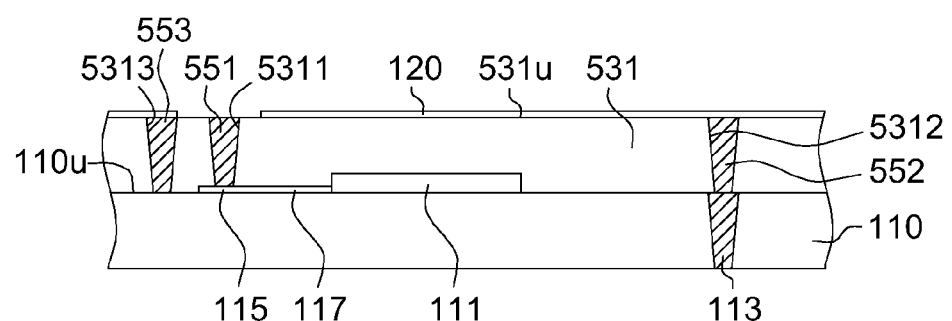

Referring to FIG. 14C, the feeding element 551 is formed by filling the feeding through holes 5311 with conductive material by plating or applying solder paste or another type of conductive material. The feeding element 551 contacts the feeding contact 115. In addition, the grounding element 552 is formed by filling the grounding through holes 5312 with conductive material by plating or applying solder paste or another type of conductive material. The grounding element 552 contacts the grounding element 113. In addition, the conductive element 553 is formed by filling the through hole 5313 with conductive material by plating or applying solder paste or another type of conductive material.

Referring to FIG. 14C, the grounding layer 120 is formed on the upper surface 531u of the package body 531 by material formation technology such as chemical vapor deposition, electroless plating, electrolytic plating, printing, spinning, spraying, sputtering, or vacuum deposition, wherein the grounding layer 120 overlaps the chip 111.

Figure 14D:
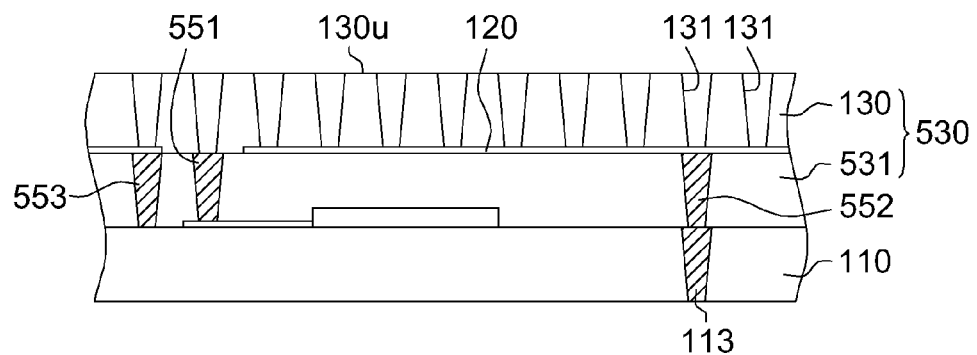

Referring to FIG. 14D, the encapsulant 130 encapsulating the grounding layer 120 is formed, wherein the encapsulant 130 has upper surface 130u. The encapsulant 130 and the package body 531 together form the covering 530.

Referring to FIG. 14D, several through holes 131 exposing the grounding layer 120 and the feeding element 551 from the upper surface 130u of the encapsulant 130 are formed by using an appropriate laser or cutting tool.

Figure 14E:
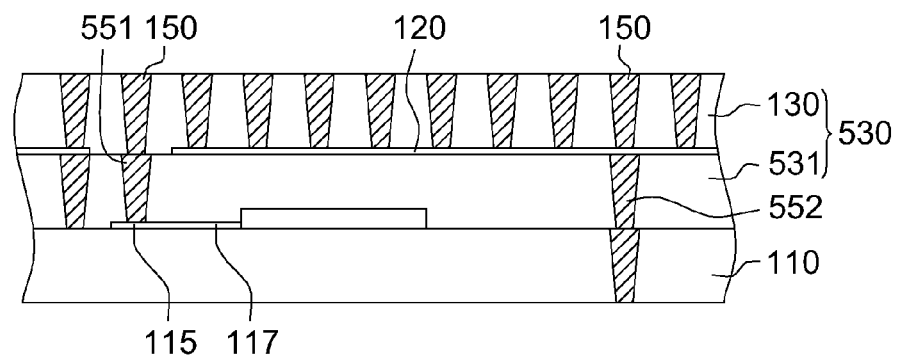

Referring to FIG. 14E, several conductive elements 150 are formed by filling the through holes 131 with conductive material by plating or applying solder paste or another type of conductive material. The conductive elements 150 contact the grounding layer 120 and the feeding element 551.

Figure 14F:
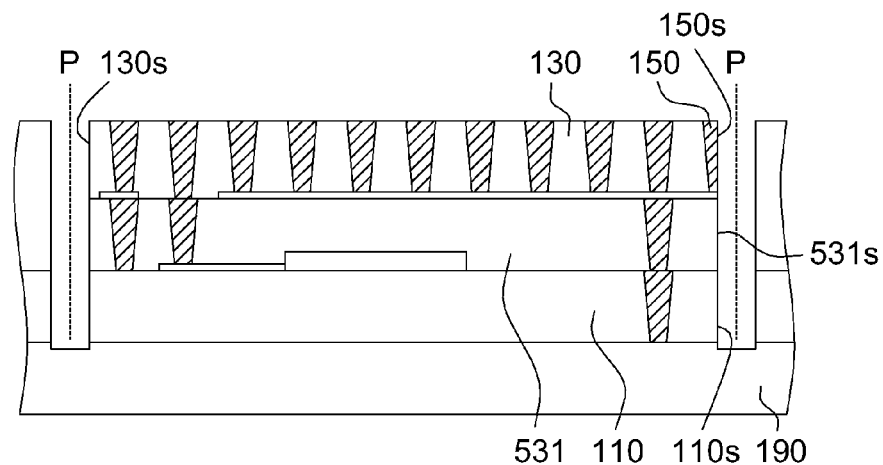

Referring to FIG. 14F, several singulation paths P passing through the encapsulant 130, the package body 531, the conductive elements 150 and the substrate 110 are formed using a laser or cutting tool. After the singulation paths P are formed, lateral surface 150s of the conductive elements 150, lateral surface 130s of the encapsulant 130, lateral surface 531s of the package body 531 and lateral surface 110s of the substrate 110 are exposed from the singulation paths P. In addition, the substrate 110 can be attached to a carrier 190 before the singulation paths P is formed. Singulation paths P may pass through a part of the carrier 190 to completely cut off the substrate 110, the package body 531 and the encapsulant 130.

Figure 14G:
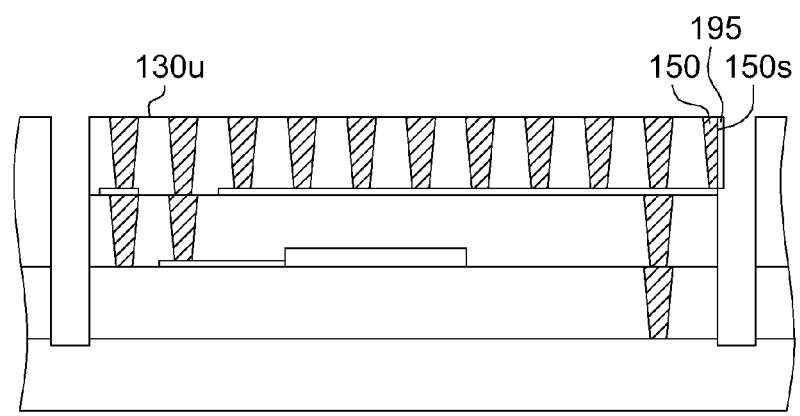

Referring to FIG. 14G, tape 195 is attached on the exposed lateral surface 150s to define the aperture 140a (illustrated in FIG. 5B) of the shielding layer 140. Then, shielding layer 140 covering the upper surface 130u and a portion of lateral surface 130s of the encapsulant 130, which is not covered by the tape 195, is formed. After the tape 195 is removed, the semiconductor package 500 illustrated in FIG. 5B is formed. The shielding layer 140 can be formed using plating/etching photolithographic processes.

Figure 15:
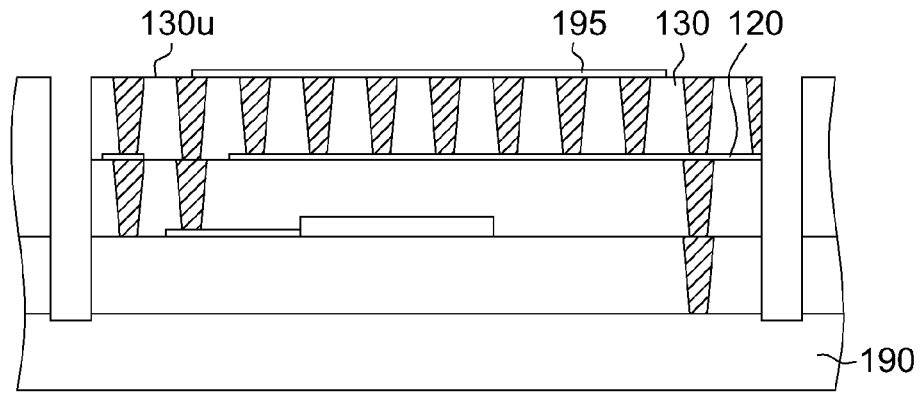
FIG. 15 illustrates a manufacturing process according to the semiconductor package of FIG. 6.

Referring to FIG. 15, a manufacturing process according to the semiconductor package of FIG. 6 is illustrated. Tape 195, such as a rectangular shape or other applicable shape, is attached to the upper surface 130u of the encapsulant 130 overlapping to a region of the grounding layer 120 to define the aperture 140a of the shielding layer 140 of FIG. 6. The processes are similar to those for the semiconductor 100, and the similarities are not repeated here.

Figure 16:
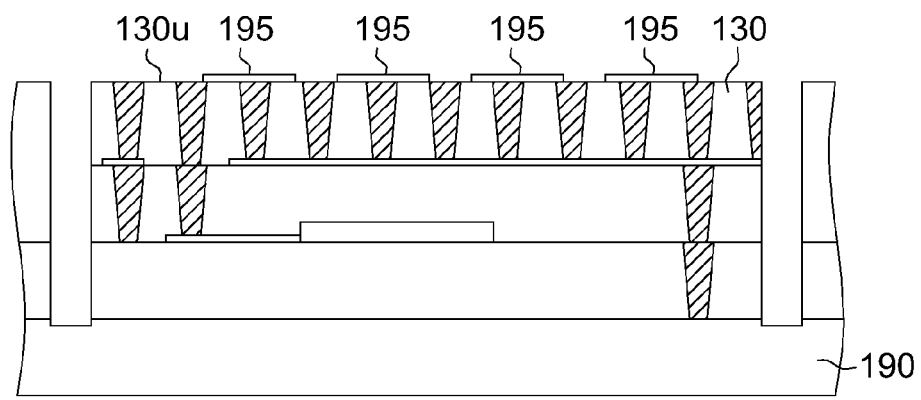
FIG. 16 illustrates a manufacturing process according to the semiconductor package of FIG. 7.

Referring to FIG. 16, a manufacturing process according to the semiconductor package of FIG. 7 is illustrated. Tapes 195, such as rectangular shapes or other applicable shapes, are attached to the upper surface 130u of the encapsulant 130 overlapping to a region of the grounding layer 120 to define the apertures 140a of the shielding layer 140 of FIG. 7. The processes are similar to those for the semiconductor 100, and the similarities are not repeated here.

Figure 17A:
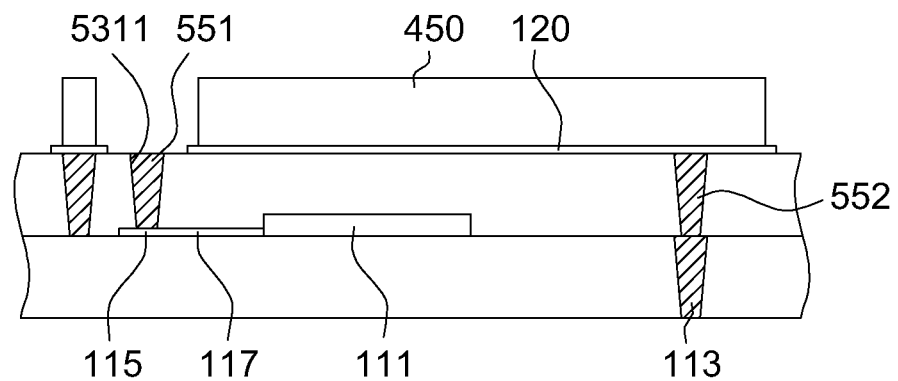
FIGS. 17A-17C illustrate manufacturing processes according to the semiconductor package of FIG. 8B.
Figure 17B:
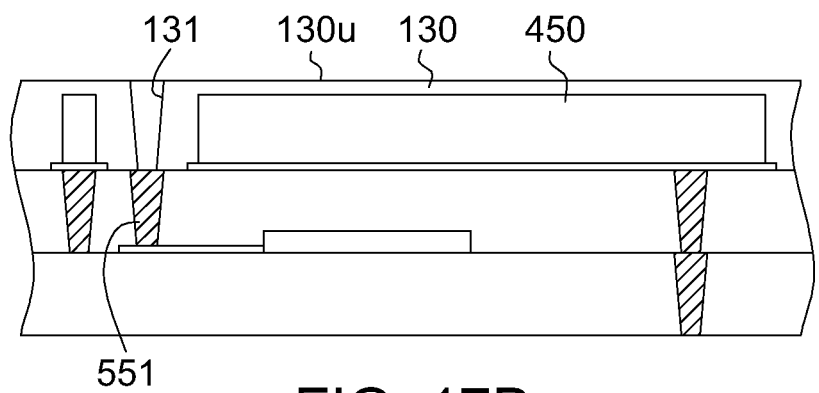
Figure 17C:
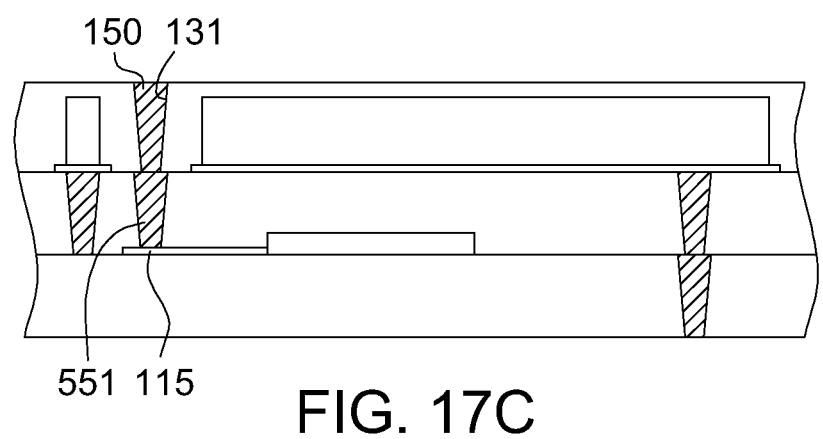

Referring to FIG. 17A-17C, manufacturing processes according to the semiconductor package of FIG. 8B are illustrated.

Referring to FIG. 17A, conductive element 450 of FIG. 8B is disposed on the grounding layer 120 using, for example, surface mount technology (SMT). The feeding element 551 is physically separated and electrically isolated form the conductive element 450, that is, the conductive element 450 does not contact the feeding element 551.

Referring to FIG. 17B, encapsulant 130 encapsulating the conductive element 450 is formed, wherein the encapsulant 130 has an upper surface 130u. The through hole 131 exposing the feeding element 551 from the upper surface 130u of the encapsulant 130 is formed by using an appropriate laser or cutting tool.

Referring to FIG. 17C, the conductive element 150 is formed by filling the through holes 131 with conductive material by plating, solder paste or other forms of applying conductive material. The conductive element 150 contacts the feeding element 551 for electrically connecting to the feeding contact 115. The processes are similar to those for the semiconductor 100, and the similarities are not repeated here.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package comprising:
a substrate including a chip;
a grounding layer disposed on the substrate;
an encapsulant covering the chip and the grounding layer;
a conductive via extending from an upper surface of the encapsulant to the grounding layer;
a shielding layer disposed on the encapsulant, the shielding layer
electrically connected to the conductive via;
at least one signal emitting opening in the encapsulant exposing a cavity defining a waveguide;
a feeding contact on the substrate; and
a conductive element disposed directly on the feeding contact and encapsulated by the encapsulant;
wherein the signal emitting opening is disposed on a lateral surface of the encapsulant and corresponds to the conductive element, and
wherein the conductive via and the conductive element are arranged along the waveguide, and
wherein the conductive via and the conductive element have a substantially same height.

2. The semiconductor package of claim 1, wherein the grounding layer, the shielding layer, the conductive via and the conductive element form an antenna.

3. The semiconductor package of claim 1, wherein the conductive via is useable to transmit a radio frequency signal.

4. The semiconductor package of claim 1, wherein the at least one signal emitting opening includes an opening formed on a lateral surface of the encapsulant.

5. The semiconductor package of claim 1, wherein the at least one signal emitting opening includes a plurality of openings formed on the upper surface of the encapsulant.

6. The semiconductor package of claim 5, wherein the openings are substantially rectangular and arranged in a linear fashion.

7. The semiconductor package of claim 1, wherein the conductive via and the conductive element are arranged along the waveguide to form a funnel-like pattern.

8. The semiconductor package of claim 1, further including a conductive frame within the cavity extending from the conductive via outwardly to the signal emitting opening.

9. A semiconductor package comprising:
a substrate including a chip;
a package body encapsulating the chip;
a grounding layer disposed on an upper surface of the package body;
an encapsulant covering the package body and the grounding layer;
a conductive via extending from an upper surface of the encapsulant to the grounding layer;
a shielding layer disposed on the encapsulant, the shielding layer electrically connected to the conductive via;
at least one signal emitting opening in the encapsulant exposing a cavity defining a waveguide;
a feeding contact on the substrate; and
a conductive element disposed directly on the feeding contact and encapsulated by the encapsulant;
wherein the signal emitting opening is disposed on a lateral surface of the encapsulant and corresponds to the conductive element, and
wherein the conductive via and the conductive element are arranged along the waveguide.

10. The semiconductor package of claim 9, wherein the conductive via is useable to transmit a radio frequency signal.

11. The semiconductor package of claim 9, wherein the grounding layer, the shielding layer, the conductive via and the conductive element form an antenna.

12. The semiconductor package of claim 9, wherein the waveguide overlaps the chip.

13. The semiconductor package of claim 9, wherein the waveguide is funnel shaped.

14. The semiconductor package of claim 9, wherein the conductive via and the conductive element are arranged along the waveguide to form a funnel-like pattern.

* * * * *